United States Patent
Kasuga et al.

(10) Patent No.: US 11,153,521 B2
(45) Date of Patent: Oct. 19, 2021

(54) SOLID-STATE IMAGE SENSOR AND IMAGING DEVICE

(71) Applicant: PANASONIC INTELLECTUAL PROPERTY MANAGEMENT CO., LTD., Osaka (JP)

(72) Inventors: Shigetaka Kasuga, Osaka (JP); Manabu Usuda, Hyogo (JP); Kentaro Nakanishi, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/688,796

(22) Filed: Nov. 19, 2019

(65) Prior Publication Data

US 2020/0106982 A1    Apr. 2, 2020

Related U.S. Application Data

(63) Continuation of application No. PCT/JP2018/015784, filed on Apr. 17, 2018.

(30) Foreign Application Priority Data

May 25, 2017    (JP) .............................. JP2017-103703

(51) Int. Cl.
   *H04N 5/3745*    (2011.01)
   *H01L 27/146*    (2006.01)
   *H01L 31/107*    (2006.01)

(52) U.S. Cl.
   CPC ..... *H04N 5/3745* (2013.01); *H01L 27/14612* (2013.01); *H01L 31/107* (2013.01)

(58) Field of Classification Search
   CPC .............. H04N 5/3745; H04N 5/37452; H01L 27/14612; H01L 31/107; H01L 27/14654; H01L 27/146

See application file for complete search history.

(56) References Cited

U.S. PATENT DOCUMENTS

| | | | |
|---|---|---|---|
| 4,710,817 A | 12/1987 | Ando | |
| 6,246,043 B1 * | 6/2001 | Merrill | H04N 5/363 |
| | | | 250/208.1 |

(Continued)

FOREIGN PATENT DOCUMENTS

| | | |
|---|---|---|
| JP | S61-152176 A | 7/1986 |
| JP | H07-67043 A | 3/1995 |

(Continued)

OTHER PUBLICATIONS

Neale A.W. Dutton, et al., "9.8μm SPAD-based Analogue Single Photon Counting Pixel with Bias Controlled Sensitivity," International Image Sensors Workshop, Jun. 2013.

(Continued)

*Primary Examiner* — Abdelaaziz Tissire
(74) *Attorney, Agent, or Firm* — McDermott Will and Emery LLP

(57) ABSTRACT

A solid-state image sensor includes a pixel array including pixel cells arranged in a matrix. Each of the pixel cells includes an avalanche photodiode, a floating diffusion which accumulates charges, a transfer transistor which connects a cathode of the avalanche photodiode to the floating diffusion, a first reset transistor for resetting charges collected in the cathode of the avalanche photodiode, a second reset transistor for resetting charges accumulated in the floating diffusion, an amplification transistor for converting a charge amount of charges accumulated in the floating diffusion into a voltage, a memory which accumulates charges, and a count transistor which connects the floating diffusion to the memory.

13 Claims, 16 Drawing Sheets

(56) References Cited

U.S. PATENT DOCUMENTS

| | | | |
|---|---|---|---|
| 2001/0025977 A1 | 10/2001 | Hieda | |
| 2004/0130757 A1 | 7/2004 | Mabuchi | |
| 2007/0051988 A1* | 3/2007 | Koga | H04N 5/335 257/239 |
| 2007/0131991 A1* | 6/2007 | Sugawa | H01L 27/14609 257/292 |
| 2009/0256223 A1 | 10/2009 | Yamamura et al. | |
| 2010/0188543 A1* | 7/2010 | Oike | H04N 5/37452 348/308 |
| 2012/0205522 A1* | 8/2012 | Richardson | H04N 5/378 250/214.1 |
| 2015/0054111 A1 | 2/2015 | Niclass et al. | |
| 2016/0216381 A1* | 7/2016 | Nishihara | G01T 1/2018 |
| 2016/0344965 A1* | 11/2016 | Grauer | H04N 5/3594 |
| 2017/0257578 A1* | 9/2017 | Velichko | H04N 5/2357 |
| 2018/0278877 A1 | 9/2018 | Yamahira | |

FOREIGN PATENT DOCUMENTS

| | | |
|---|---|---|
| JP | H09-008249 A | 1/1997 |
| JP | 2001-345434 A | 12/2001 |
| JP | 2004-140149 A | 5/2004 |
| JP | 2010-109902 A | 5/2010 |
| JP | 2010-177321 A | 8/2010 |
| JP | 2013-048278 A | 3/2013 |
| JP | 2015-041746 A | 3/2015 |
| WO | 2005/083790 A1 | 9/2005 |
| WO | 2017/098710 A1 | 6/2017 |

OTHER PUBLICATIONS

International Search Report and Written Opinion dated Jul. 17, 2018 in International Application No. PCT/JP2018/015784; with partial English translation.

* cited by examiner

SOLID-STATE IMAGE SENSOR AND IMAGING DEVICE

CROSS REFERENCE TO RELATED APPLICATIONS

This application is a U.S. continuation application of PCT International Patent Application Number PCT/JP2018/015784 filed on Apr. 17, 2018, claiming the benefit of priority of Japanese Patent Application Number 2017-103703 filed on May 25, 2017, the entire contents of which are hereby incorporated by reference.

BACKGROUND

1. Technical Field

The present disclosure relates to solid-state image sensors, and particularly relates to a solid-state image sensor which detects faint light.

2. Description of the Related Art

Solid-state image sensors which detect faint light and have a photocount function are known in the related art (see Japanese Unexamined Patent Application Publication No. H7-67043, Japanese Unexamined Patent Application Publication No. S61-152176, and ISSW 2013 9.8 μm SPAD-based Analogue Single Photon Counting Pixel with Bias Controlled Sensitivity, for example).

SUMMARY

Unfortunately, those traditional solid-state image sensors having a photocount function are not always suitable for high integration because their pixel cells have a relatively large size.

An object of the present disclosure is to provide a solid-state image sensor which has a photocount function and is more suitable for high integration than those in the related art, and an imaging device.

The solid-state image sensor according to the present disclosure includes a pixel array including pixel cells arranged in a matrix. Each of the pixel cells includes an avalanche photodiode having a first mode in which a charge amount of charges approximately proportional to the number of photons which cause photoelectric conversion is collected in a cathode of the avalanche photodiode when photons enter the avalanche photodiode under application of a first bias, and a second mode in which a saturated amount of charges is collected in the cathode when photons enter the avalanche photodiode under application of a second bias having a larger potential difference from a potential difference of the first bias and one photon causes photoelectric conversion; a floating diffusion which accumulates charges; a transfer transistor which connects the cathode of the avalanche photodiode and the floating diffusion; a first reset transistor for resetting charges collected in the cathode of the avalanche photodiode; a second reset transistor for resetting charges accumulated in the floating diffusion; an amplification transistor for converting a charge amount of the charges accumulated in the floating diffusion into a voltage; a memory which accumulates charges; and a count transistor which connects the floating diffusion and the memory The memory may have a capacity that is at least five times a capacity of the floating diffusion.

The memory may be a capacitor having a laminate structure.

The memory may be a capacitor including an electrode, a semiconductor layer, and an insulating layer disposed between the electrode and the semiconductor layer.

The memory may be a capacitor including a first electrode, a second electrode, and an insulating layer disposed between the first electrode and the second electrode.

The avalanche photodiode, the floating diffusion, the transfer transistor, the first reset transistor, the second reset transistor, and the amplification transistor may be disposed in a semiconductor substrate. The capacitor may include the first electrode and the second electrode facing each other, and the insulating layer interposed between the first electrode and the second electrode. The first electrode and the second electrode may be disposed in a wiring layer region located vertically above a main flat surface of the semiconductor substrate, and first electrodes in the pixel cells may be connected to each other without a via.

The first electrode may be grounded at a predetermined potential through a via outside the pixel array.

The first reset transistor may have a threshold voltage equal to or lower than a threshold voltage of the transfer transistor.

A potential barrier between a source and a drain of the first reset transistor under application of a first voltage to a gate of the first reset transistor may be lower than a potential barrier between a source and a drain of the transfer transistor under application of a second voltage to a gate of the transfer transistor.

Among the charges collected in the cathode of the avalanche photodiode, at least part of charges having a potential higher than the potential barrier between the source and the drain of the first reset transistor may be transferred to the drain of the first reset transistor.

In an operation in the second mode, the potential barrier between the source and the drain under application of a third voltage to the gate of the transfer transistor may be higher than a potential of the floating diffusion initialized by the second reset transistor.

In an operation in the first mode, the potential barrier between the source and the drain under application of a fourth voltage to the gate of the transfer transistor may be equal to or lower than the potential of the floating diffusion initialized by the second reset transistor.

The imaging device according to present disclosure includes the solid-state image sensor, and a signal processing circuit which sets a bias to be applied to the avalanche photodiode at one of the first bias and the second bias based on a signal output from the solid-state image sensor.

With the above configuration of the solid-state image sensor, a solid-state image sensor having a photocount function can be implemented using a pixel cell having a smaller number of elements than those in the related art. For this reason, the pixel cell can have a size smaller than those of pixel cells in conventional solid-state image sensors.

Accordingly, the above configuration of the solid-state image sensor can provide a solid-state image sensor which has a photocount function and is more suitable for higher integration than those in the related art.

The imaging device having the above configuration includes a solid-state image sensor having the above configuration.

Accordingly, the above configuration of the imaging device can provide an imaging device more suitable for higher integration than those in the related art.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT (How One Aspect of the Present Disclosure has been Achieved)

Recently, faint light sensors for accurately measuring faint light corresponding to one photon have been needed in a variety of fields of medical and bio applications and measurement of radiation rays. Such faint light sensors widely used at present include photomultiplier tubes (PMTs). Unfortunately, the PMTs, which are vacuum tube devices, have a dimension of about 10 mm×10 mm, obstructing an increase in the number of pixels. In addition, imaging using the PMT requires processing of collecting information about points of a target object by a method of scanning the target object within an XY plane, for example, and then converting the information into an image. Such processing leads to difficulties in real-time photographing. Under such circumstances, there is a demand for faint light sensors in the form of a solid-state image sensor in order to implement a faint light sensor having an increased number of pixels and high-speed performance at the same time.

As one of solid-state image sensors which detect faint light, photocount solid-state image sensors have been proposed, each of which counts photons which cause photoelectric conversion in a photodiode, and transmits the result of counts as a signal having a digital value to the outside of the pixel.

Figure 15A:
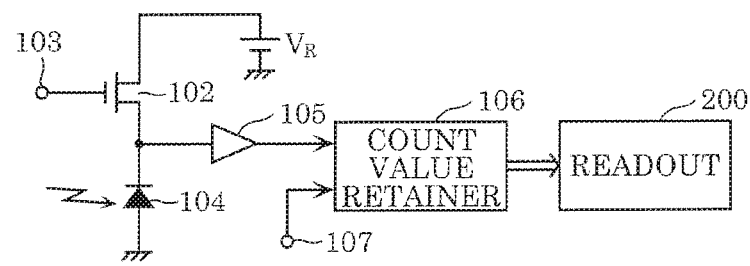
FIG. 15A is a conceptual diagram illustrating a solid-state image sensor in the related art.
Figure 15B:
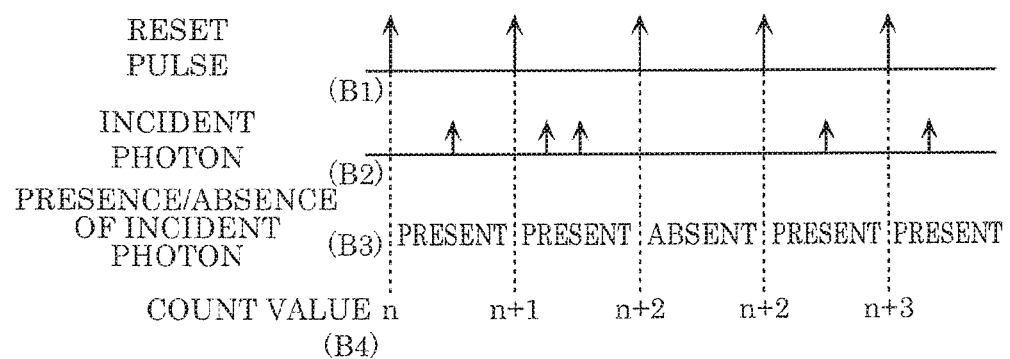
FIG. 15B is a timing diagram illustrating an operation of the solid-state image sensor in the related art.
Figure 15C:
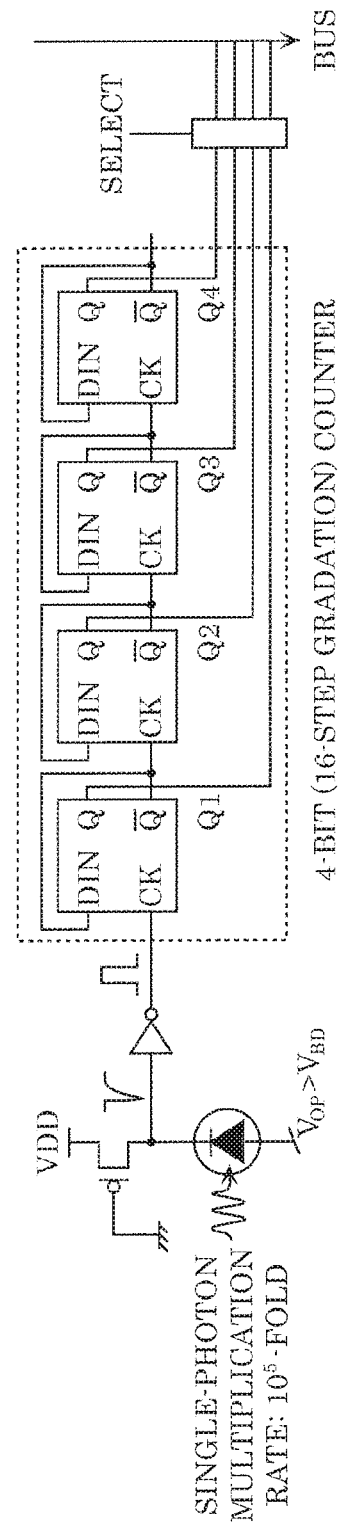
FIG. 15C is a block diagram illustrating a counter circuit of the solid-state image sensor in the related art.

For example, in photocount solid-state image sensors according to PTLs 1 and 2, when one or more photons cause photoelectric conversion between resets at the timing illustrated in FIG. 15B, a photodiode having a circuit illustrated in FIG. 15A determines that a photon is present, and generates a pulse signal. The pulse signal then increases the count value of the digital counter circuit illustrated in FIG. 15C by one.

Figure 16:
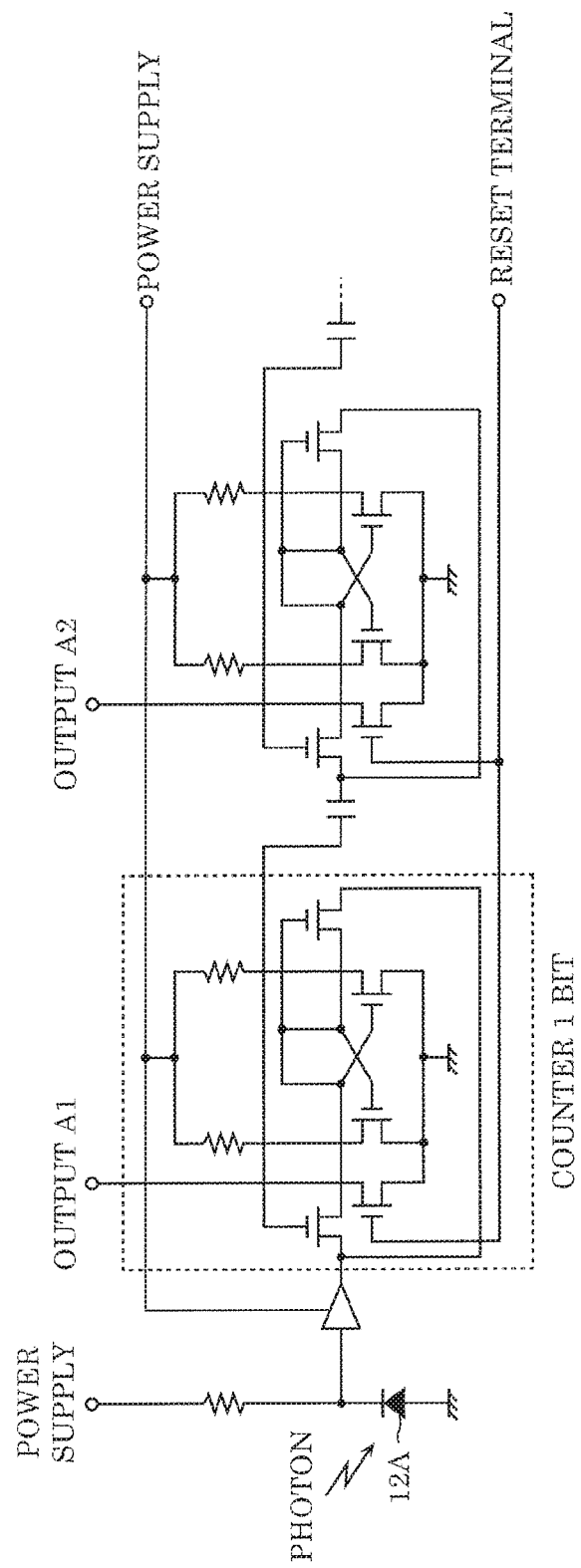
FIG. 16 is a conceptual diagram illustrating the solid-state image sensor in the related art.

Unfortunately, in the case where the digital count circuit as a counter is mounted on a pixel as described in PTLs 1 and 2, even a count circuit of one bit increases the circuit scale as illustrated in FIG. 16. An increase in the number of bits to provide desired gradation results in a proportional increase in the number of circuit elements and that of signal lines according to the number of bits. It is apparent that this results in an increased pixel cell size, obstructing an increase in the number of pixels.

Figure 17A:
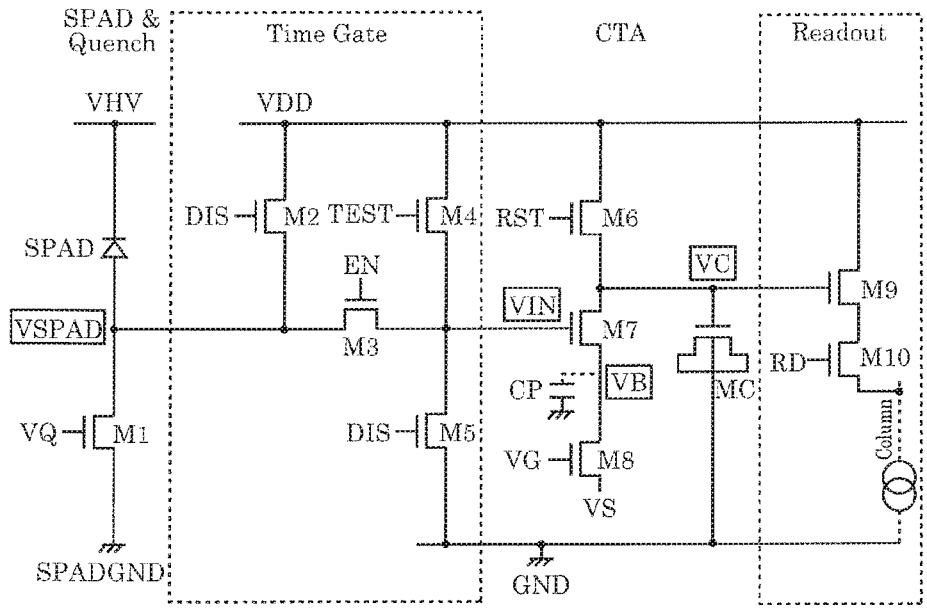
FIG. 17A is a circuit diagram illustrating a pixel circuit in the related art.

Recently, as described in NPL 1, there is another type of solid-state image sensor having a structure including an array of avalanche photodiodes (so-called Geiger mode APDs), to which a load resistor is connected and a high voltage equal to or higher than the breakdown voltage is applied. In this solid-state image sensor, an analog circuit as a counter is mounted on a pixel circuit to solve the problems of conventional digital count circuits in the related art described above. The pixel circuit is illustrated in FIG. 17A.

Figure 17B:
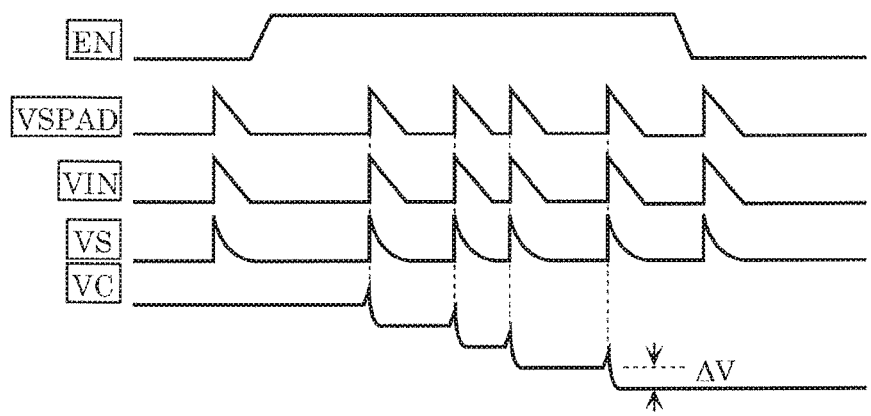
FIG. 17B is a timing diagram illustrating an operation of the pixel circuit in the related art.
Figure 17C:
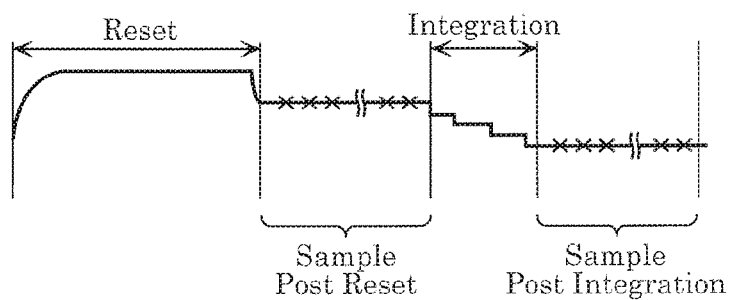
FIG. 17C is a timing diagram illustrating an operation to count the number of photons in the related art.

In this pixel circuit, every time when a photon enters a light receiving element at the timing illustrated in FIG. 17B, a detector discharges charges from holder MC which holds an initial voltage. Actually, however, a variation in amplitude VIN caused by the intensity of photon energy and a variation in parasitic capacity CP of control transistor M7 results in a variation in amount of charges discharged from the holder. For this reason, $\Delta V$ of voltage VC of holder MC is not constant. As illustrated in FIG. 17C, the number of photons is measured through comparison of the reset voltage to voltage VC of holder MC after $\Delta V$ integration is subtracted therefrom. A variation in $\Delta V$ leads to difficulties in accurate counting of the number of photons.

In consideration of such problems, the present inventor has conceived a solid-state image sensor having a configuration including the following count circuit. With one transistor and one memory element, the count circuit relaxes a variation in amplitude of a light receiving element when photons cause photoelectric conversion. The count circuit thus eliminates an error in the amount of the analog integration signal per photon to reduce errors in the detected number of photons and the count value. Furthermore, the count circuit significantly reduces the number of elements compared to that in a standard digital count circuit, enabling readout of the count value only with one analog signal line. Such a configuration can implement a multi-pixel solid-state image sensor having a high performance photocount function and having a reduced pixel size.

Embodiment

The solid-state image sensor according to an embodiment will now be described with reference to the drawings.

[1. Configuration]

The solid-state image sensor according to the embodiment includes a pixel array including pixel cells arranged in a matrix.

Figure 1:
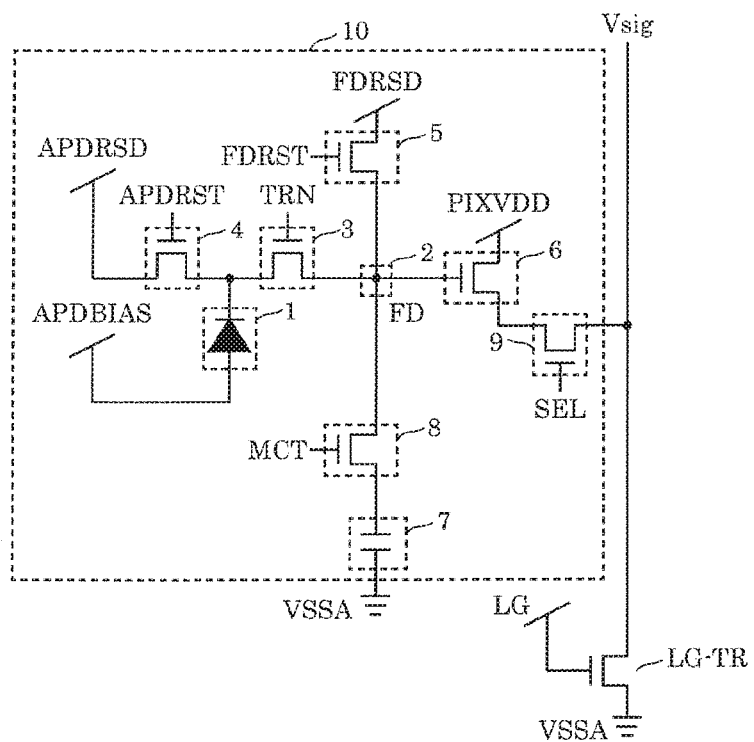
FIG. 1 is a circuit diagram illustrating a pixel cell according to an embodiment.

FIG. 1 is a circuit diagram illustrating pixel cell 10 according to the present embodiment.

As illustrated in the drawing, pixel cell 10 includes avalanche photodiode 1, floating diffusion 2 which accumulates charges, transfer transistor 3 which connects a cathode of avalanche photodiode 1 and floating diffusion 2, first reset transistor 4 for resetting charges collected in the cathode of avalanche photodiode 1, second reset transistor 5 for resetting charges accumulated in floating diffusion 2, amplification transistor 6 which converts the charge amount of charges accumulated in floating diffusion 2 into a voltage, memory 7 which accumulates charges, and count transistor 8 which connects floating diffusion 2 to memory 7. Pixel cell 10 may further include selection transistor 9 which connects amplification transistor 6 and vertical signal line Vsig.

Here, avalanche photodiode 1 has a first mode in which a charge amount of charges approximately proportional to the number of photons which cause photoelectric conversion is collected in a cathode in the case where photons enter avalanche photodiode 1 under application of a first bias (for example, −25 V), and a second mode in which a saturated amount of charges is collected in the cathode in the case where photons enter avalanche photodiode 1 under application of a second bias (for example, −27 V) having a larger potential difference from that of the first bias and one photon causes photoelectric conversion.

Here, the first operational mode of avalanche photodiode 1 to collect the charges approximately proportional to the number of photons causing the photoelectric effect in the cathode is also referred to as a linear multiplication mode. The second operational mode of avalanche photodiode 1 to collect the saturated amount of charges in the cathode when one photon causes the photoelectric effect is also referred to as a Geiger multiplication mode.

Hereinafter, avalanche photodiode 1 is referred to as APD, floating diffusion 2 as FD, transfer transistor 3 as TRN-TR, first reset transistor 4 as ADPRST-TR, second reset transistor 5 as FDRST-TR, amplification transistor 6 as SF-TR, and count transistor 8 as MCT-TR in some cases.

Although the first bias is −25 V, for example, and the second bias is −27 V, for example, in this description, these specific examples are only illustrative. In other words, the first bias can have any value at which the charge amount of charges approximately proportional to the number of photons causing photoelectric conversion can be collected in the cathode. The second bias can have any value which has a larger potential difference from that of the first bias and allows the saturated amount of charges to be collected in the cathode when one photon causes photoelectric conversion.

Signals to be connected to pixel cell 10 will now be described.

APDRST is a signal for controlling first reset transistor 4, and is an APD reset signal for resetting the charges of the cathode of avalanche photodiode 1.

TRN is a signal for controlling transfer transistor 3, and is a transfer signal for transferring the charges of the cathode of avalanche photodiode 1 to floating diffusion 2.

FDRST is a signal for controlling second reset transistor 5, and is an FD reset signal for resetting the charges of floating diffusion 2.

MCT is a signal for controlling count transistor 8, and is a photocount signal for controlling the connection state between floating diffusion 2 and memory 7.

SEL is a signal for controlling selection transistor 9, and is a row selection signal.

APDBIAS is a power supply to apply voltage to the anode of avalanche photodiode 1.

APDRSD is a reset drain power supply of avalanche photodiode 1.

FDRSD is a reset drain power supply of floating diffusion 2.

PIXVDD is a power supply of amplification transistor 6.

Pixel cell 10 can change the multiplication rate of avalanche photodiode 1 by changing APDBIAS.

Figure 2:
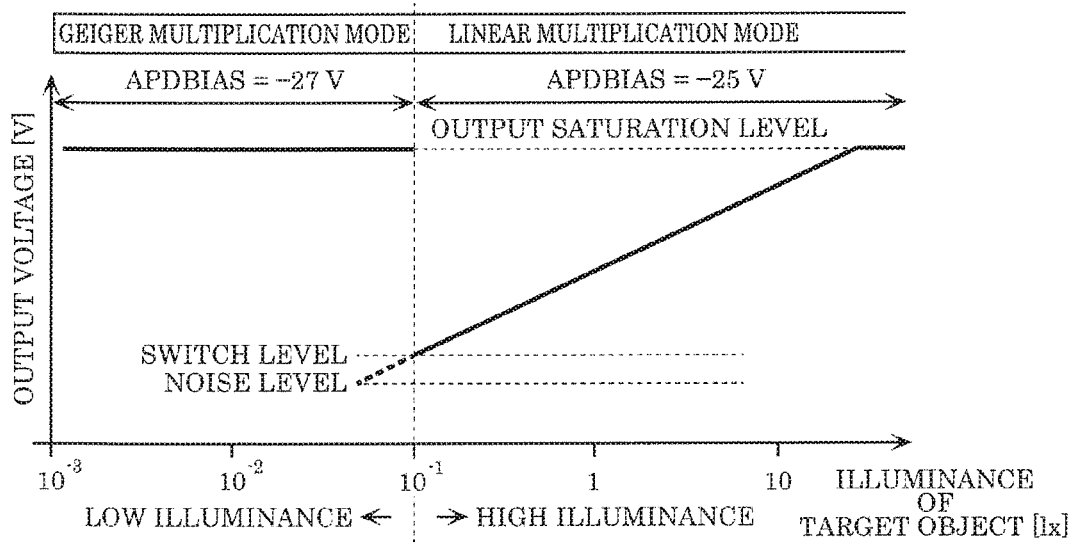
FIG. 2 is a diagram illustrating an example of switching of an operational mode.

For example, as illustrated in FIG. 2, in the case where the target object has an illuminance higher than 0.1 lx, APDBIAS may be set at −25 V and the operational mode of avalanche photodiode 1 may be the linear multiplication mode. Similarly to a standard image sensor, in avalanche photodiode 1 in this linear multiplication mode, the amount of charges to be collected in the cathode is increased approximately proportional to the illuminance.

In the case where the target object has an illuminance lower than 0.1 lx, APDBIAS may be set at −27 V and the operational mode of avalanche photodiode 1 may be the Geiger multiplication mode. In avalanche photodiode 1 in this Geiger multiplication mode, avalanche breakdown occurs as a result of photoelectric conversion caused by one photon, and the amount of charges collected in the cathode reaches the saturated level. A white image is formed as a result of saturated output from a pixel cell 10 where the photon causes the photoelectric effect, and a black image is formed in a pixel where the photon does not cause the photoelectric effect. Accordingly, the image of the target object is represented with a dot density using binary values of black and white. To express the dot density in the form of an image with gradation, each pixel cell 10 includes memory 7.

Memory 7 having a larger capacity can expand the dynamic range of the output voltage because such a memory can accumulate a larger charge amount and integrate a larger number of photons.

Figure 3:
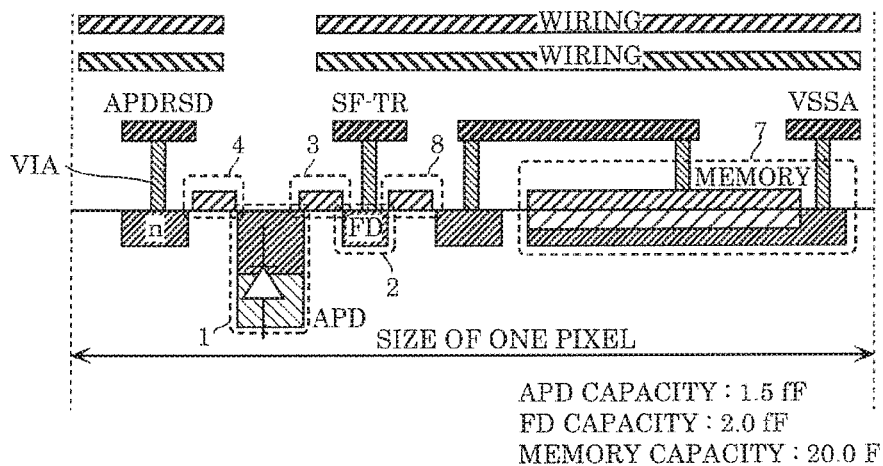
FIG. 3 is a sectional view illustrating a first exemplary layout of the pixel cell according to the embodiment.

FIG. 3 illustrates a sectional view of a first exemplary layout of pixel cell 10.

As illustrated in the drawing, the memory 7 in the first exemplary layout is implemented with a capacitor having a laminate structure including an electrode, a semiconductor layer, and an insulating layer between the electrode and the semiconductor layer.

Figure 4:
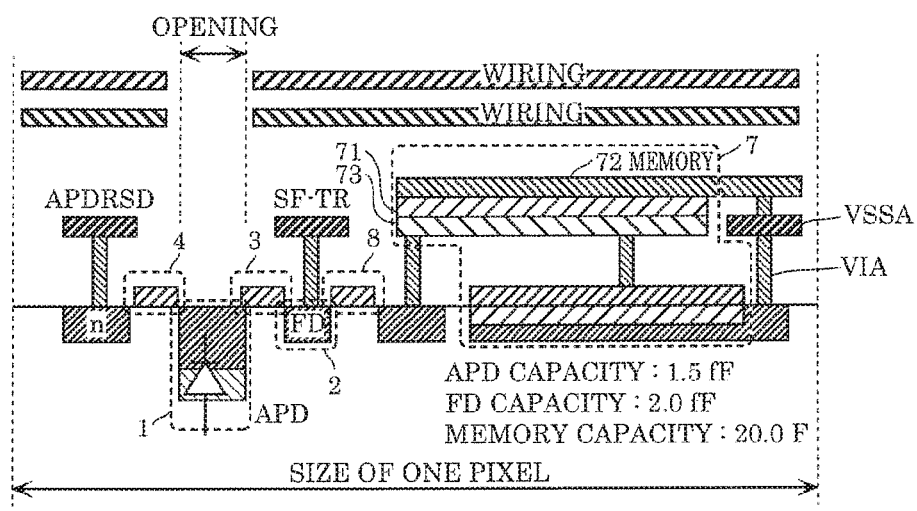
FIG. 4 is a sectional view illustrating a second exemplary layout of the pixel cell according to the embodiment.

FIG. 4 illustrates a sectional view of a second exemplary layout of pixel cell 10.

As illustrated in the drawing, the memory 7 in the second exemplary layout is implemented with a capacitor having a laminate structure and formed in a wiring layer region located vertically above a main flat surface of a semiconductor substrate. The capacitor may have a configuration including first electrode 72 composed of a TiN member, second electrode 73 composed of a TiN member, and insulating layer 71 disposed between first electrode 72 and second electrode 73 and composed of a SiN member, for example. Here, first electrode 72 and second electrode 73 face each other with insulating layer 71 interposed therebetween.

In the pixel cell 10 in the second exemplary layout, memory 7 is disposed in the wiring layer region. Such a configuration can provide a pixel having a reduced size compared to that of pixel cell 10 in the first exemplary layout.

Here, it is assumed in the second exemplary layout that photons enter avalanche photodiode 1 vertically from above the main flat surface of the semiconductor substrate (namely, from above the front surface). For this reason, part of the wiring layer region should have an opening from which photons enter avalanche photodiode 1.

Figure 5:
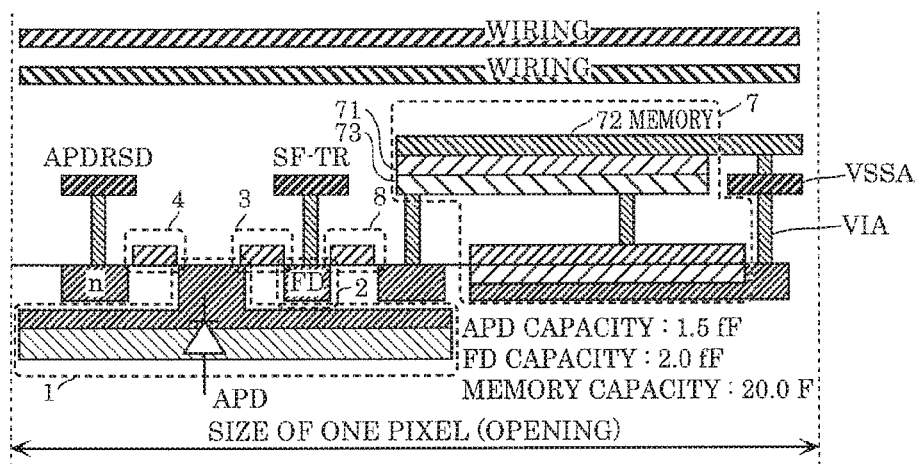
FIG. 5 is a sectional view illustrating a third exemplary layout of the pixel cell according to the embodiment.

FIG. 5 illustrates a sectional view of a third exemplary layout of pixel cell 10.

In this third exemplary layout, it is assumed that photons enter avalanche photodiode 1 from the rear surface of the semiconductor substrate.

In the third exemplary layout, photons enter pixel cell 10 from the rear surface of the semiconductor substrate, and thus the opening in the wiring region is unnecessary. As a result, a pixel cell 10 in the third exemplary layout can have a memory 7 having a larger capacity than that of the pixel cell 10 in the second exemplary layout. In the pixel cell 10 in the third exemplary layout, the opening area of avalanche photodiode 1 can be increased up to approximately a cell size of pixel cell 10. Such a configuration can increase the photoelectric conversion efficiency of the pixel cell 10 in the third exemplary layout compared to that of the pixel cell 10 in the second exemplary layout.

Figure 6:
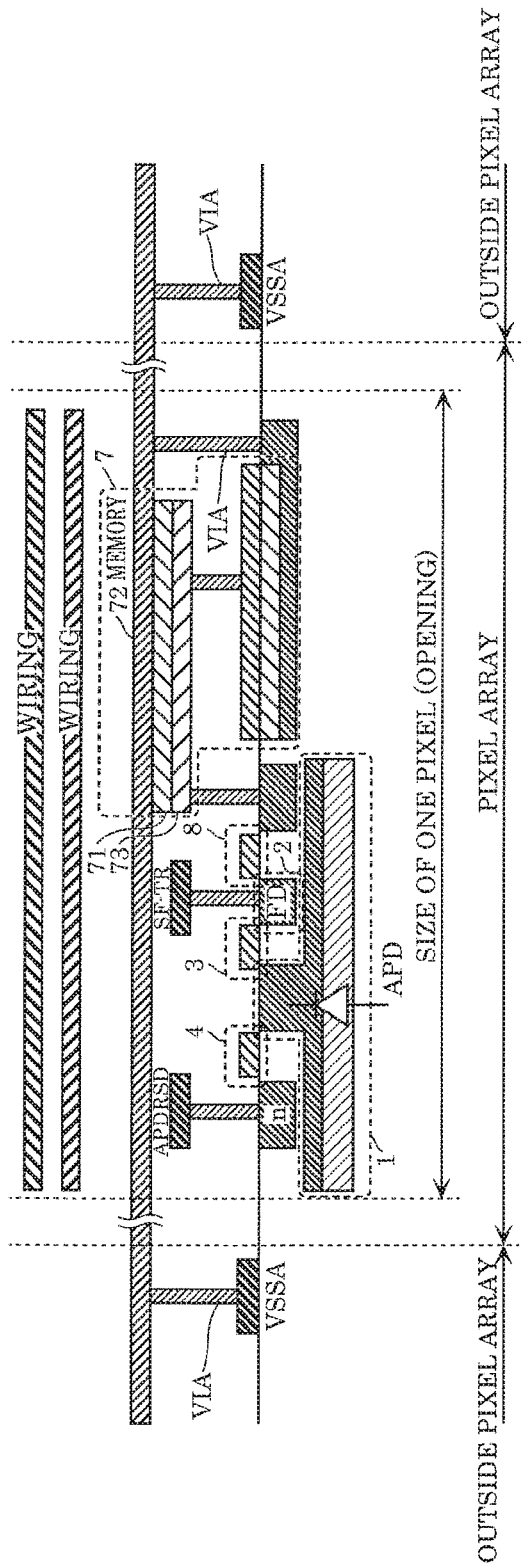
FIG. 6 is a sectional view illustrating a fourth exemplary layout of the pixel cell according to the embodiment.

FIG. 6 illustrates a sectional view of a fourth exemplary layout of pixel cell 10.

As illustrated in FIGS. 3 to 6, the first electrode (hereinafter, referred to as a "VSSA electrode"), which is one flat plate electrode forming memory 7, is connected to a fixed voltage VSSA. As illustrated in FIGS. 3 to 5, in the first to third exemplary layouts, the VSSA electrode is connected through a via to the fixed voltage VSSA within pixel cell 10. In contrast, as illustrated in FIG. 6, in the fourth exemplary layout, the VSSA electrode in pixel cell 10 is connected to VSSA electrodes in adjacent pixel cells 10 without a via, and is connected through vias to fixed voltage VSSAs outside pixel cell 10, namely, outside the pixel array. For this reason, the wiring for the fixed voltage VSSA and the via which connects the VSSA electrode and the fixed voltage VSSA do not need to be disposed within the pixel cell 10 in the fourth exemplary layout. Thus, in the pixel cell 10 in the fourth exemplary layout, memory 7 can have a size increased to approximately a cell size of pixel cell 10. For this reason, in the pixel cell 10 in the fourth exemplary layout, memory 7 can have a larger capacity than that of the memory 7 in the pixel cell 10 in the third exemplary layout.

Figure 7:
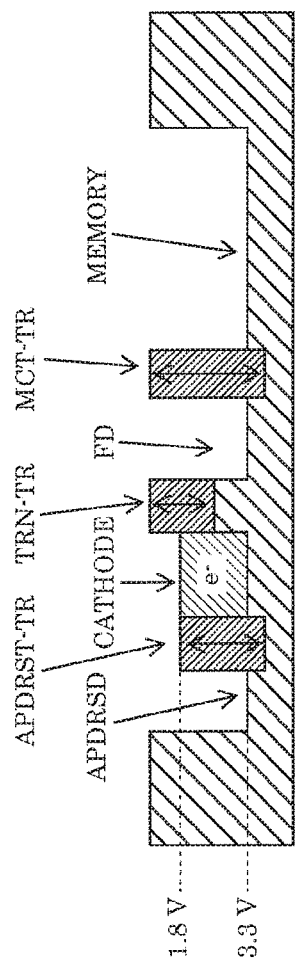
FIG. 7 is potential diagram 1 illustrating the pixel circuit according to the embodiment in a Geiger multiplication mode.

FIG. 7 is a potential diagram of pixel cell 10 when avalanche photodiode 1 is in the Geiger multiplication mode.

As described above, in avalanche photodiode 1 in the Geiger multiplication mode, photoelectric conversion caused by one photon causes avalanche breakdown, and as a result, the amount of charges collected in the cathode exceeds the maximum accumulation amount. If the charges exceeding the maximum accumulation amount leak to floating diffusion 2, memory 7, and adjacent pixel cells 10, a phenomenon called blooming occurs.

The occurrence of blooming results in mixed colors between pixels to preclude resolution of images and thus recognition of images. To prevent this, as illustrated in FIG. 7, the potential of first reset transistor 4 (APDRST-TR) when it is off is set to be lower than that of transfer transistor 3 (TRN-TR) when it is off. In other words, the potential barrier between the source and the drain of first reset transistor 4 (APDRST-TR) in the state where a first voltage (voltage for turning off first reset transistor 4 (APDRST-TR)) is applied to the gate is lower than the potential barrier between the source and the drain of transfer transistor 3 (TRN-TR) in the state where a second voltage (voltage for turning off transfer transistor 3 (TRN-TR)) is applied to the gate. As a setting method, threshold Vt of first reset transistor 4 (APDRST-TR) is set to be lower than threshold Vt of transfer transistor 3 (TRN-TR). As another method to be considered, the signal level (LOW level) of APDRST when first reset transistor 4 (APDRST-TR) is off is set to be higher than the signal level (LOW level) of TRN when transfer transistor 3 (TRN-TR) is off. By setting the potential of first reset transistor 4 (APDRST-TR) when it is off to be lower than that of transfer transistor 3 (TRN-TR) when it is off, first reset transistor 4 discharges excess charges generated more than needed in avalanche photodiode 1 to an APDRSD power supply. In other words, among the charges collected in the cathode of avalanche photodiode 1, at least part of charges having a potential higher than the potential barrier between the source and the drain of the first reset transistor 4 (APDRST-TR) is transferred to the drain of first reset transistor 4 (APDRST-TR). Blooming can be prevented by using the APDRSD power supply as a so-called overflow drain.

[2. Operation]

The operation of the solid-state image sensor according to the present embodiment including pixel cell 10 having the configuration above will now be described with reference to the drawings.

Figure 10A:
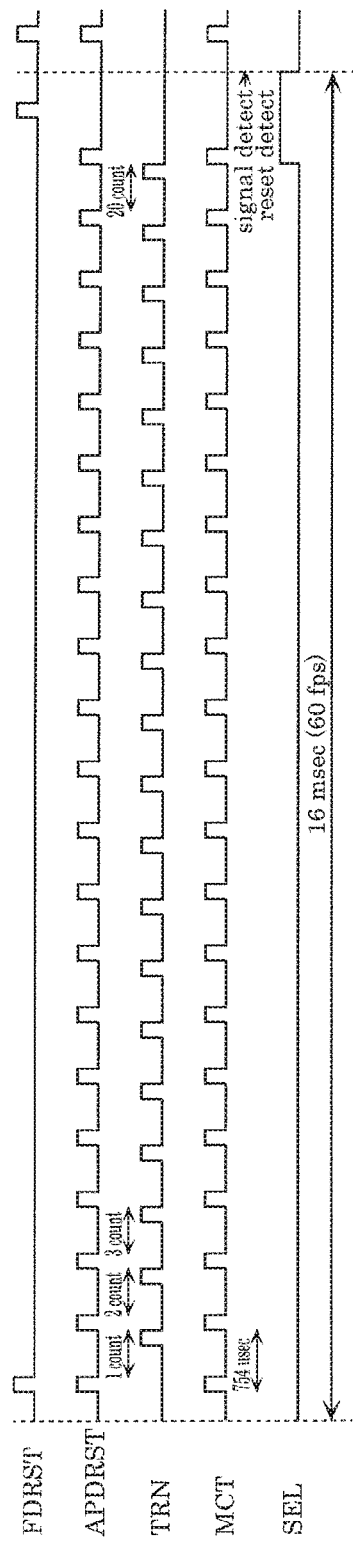
FIG. 10A is timing diagram 1 illustrating a photocount drive sequence in the Geiger multiplication mode.
Figure 10B:
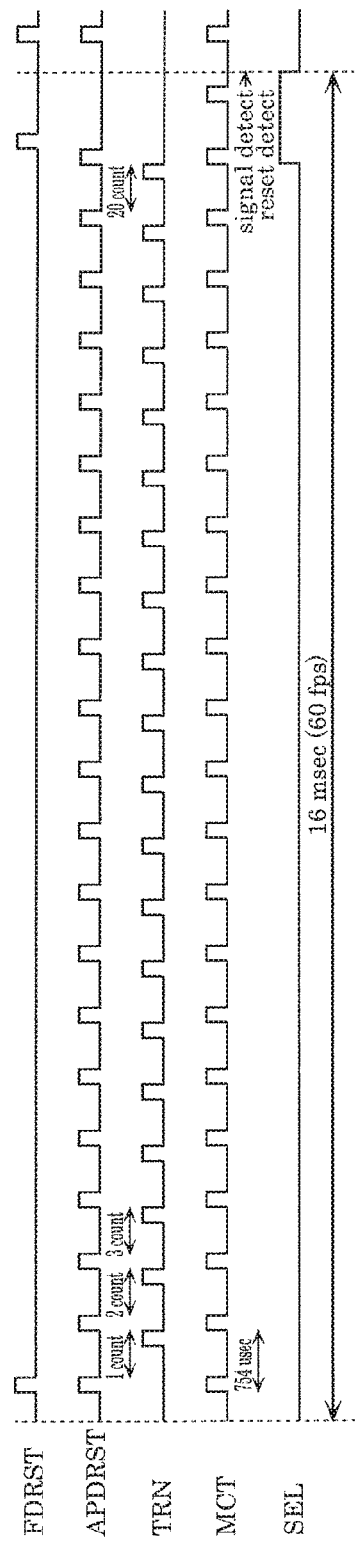
FIG. 10B is timing diagram 2 illustrating the photocount drive sequence in the Geiger multiplication mode.
Figure 11A:
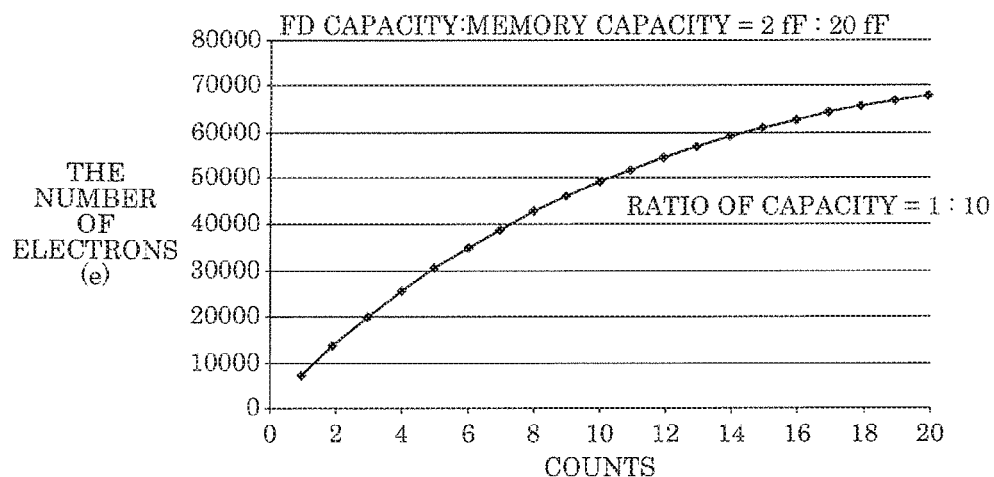
FIG. 11A is characteristic diagram 1 illustrating photocount characteristics in the Geiger multiplication mode.
Figure 11B:
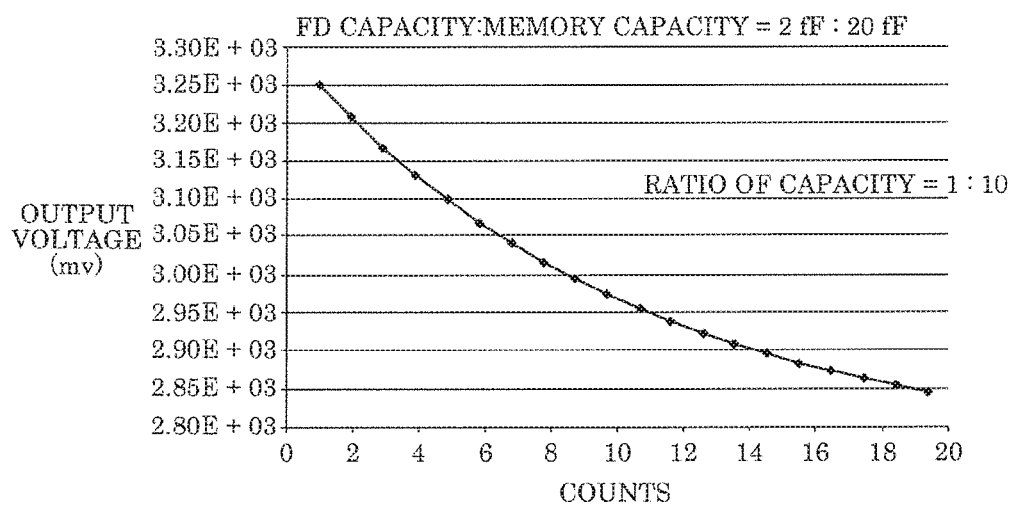
FIG. 11B is characteristic diagram 2 illustrating photocount characteristics in the Geiger multiplication mode.

FIGS. 8A to 8L and 9H to 9L are potential diagrams of a photocount drive sequence expressed with a potential when the operational mode of avalanche photodiode 1 is the Geiger multiplication mode. FIGS. 10A and 10B are timing diagrams illustrating the photocount drive sequence expressed with timing when the operational mode of avalanche photodiode 1 is the Geiger multiplication mode. FIGS. 11A and 11B are characteristic diagrams illustrating the photocount characteristics when the operational mode of avalanche photodiode 1 is the Geiger multiplication mode.

When the photocount drive sequence is started, initially, first reset transistor 4 (APDRST-TR), second reset transistor 5 (FDRST-TR), and count transistor 8 (MCT-TR) are turned on to initialize (reset) the cathode of avalanche photodiode 1, floating diffusion 2, and memory 7.

Figure 8A:
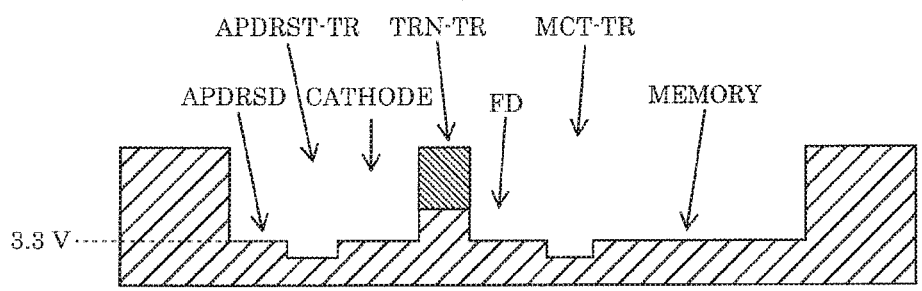
FIG. 8A is potential diagram 1 illustrating the pixel circuit according to the embodiment in the Geiger multiplication mode.

As illustrated in FIG. 8A, the potentials of the cathode of avalanche photodiode 1, floating diffusion 2, and memory 7 are set at 3.3 V through the initialization.

In the next step, first reset transistor 4 (APDRST-TR), second reset transistor 5 (FDRST-TR), and count transistor 8 (MCT-TR) are turned off. At this time, the potential at the turn-off level of first reset transistor 4 (APDRST-TR) is kept lower than that at the turn-off level of transfer transistor 3 (TRN-TR).

Figure 8B:
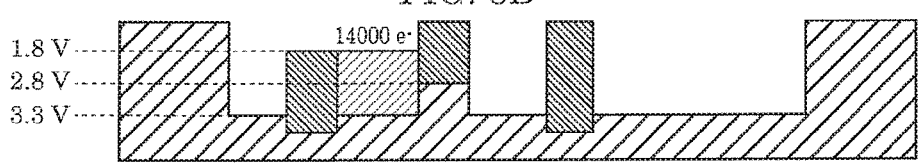
FIG. 8B is potential diagram 2 illustrating the pixel circuit according to the embodiment in the Geiger multiplication mode.

As illustrated in FIG. 8B, the potential level of first reset transistor 4 (APDRST-TR) is set at 1.8 V. The setting method is as described above.

In this state (the state where the potential level of first reset transistor 4 (APDRST-TR) is set at 1.8 V), pixel cell 10 is exposed to light.

As illustrated in FIGS. 10A and 10B, the exposure time needed to count one photon is 754 μsec. Pixel cell 10 can count up to 20 photons for 16 msec at 60 fps. When photons cause the photoelectric effect in avalanche photodiode 1 in this exposure time of 754 μsec, the amount of charges collected in the cathode of avalanche photodiode 1 reaches the saturated level. The blooming prevention function described above works to overflow the charges to the APDRSD power supply through the off potential barrier of first reset transistor 4 (APDRST-TR). The cathode of avalanche photodiode 1 has a capacity of 1.5 fF, which corresponds to 1.5 V as a difference between 1.8 V and a reference voltage of 3.3 V in the initialization of the cathode of avalanche photodiode 1. For this reason, as illustrated in FIG. 8B, the cathode of avalanche photodiode 1 holds 14000 electrons. By this operation (operation to overflow the charges to the APDRSD power supply under the action of the blooming prevention function), a uniform charge amount can be accumulated in the cathode of avalanche photodiode 1 in the case where one photon causes the photoelectric effect.

Figure 8C:
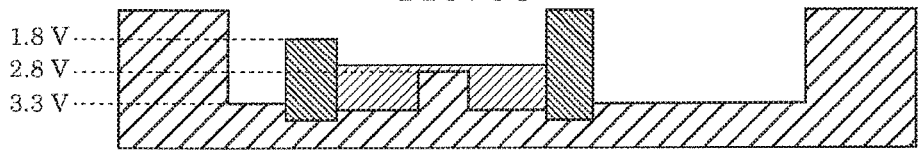
FIG. 8C is potential diagram 3 illustrating the pixel circuit according to the embodiment in the Geiger multiplication mode.

In the next step, as illustrated in FIG. 8C, transfer transistor 3 (TRN-TR) is turned on to connect the cathode of avalanche photodiode 1 and floating diffusion 2 (FD). The potential level during the turn-on of transfer transistor 3 (TRN-TR) corresponds to a level so as to provide a potential barrier of 2.8 V, rather than so as to completely connect the cathode of avalanche photodiode 1 and floating diffusion 2 (FD). In other words, the potential barrier between the source and the drain in the state where a third voltage (voltage for turning on transfer transistor 3 (TRN-TR)) is applied to the gate of transfer transistor 3 (TRN-TR) is increased by second reset transistor 5 (FDRST-TR) compared to the potential of floating diffusion 2 in the state of initialization thereof. This is for prevention of malfunction during drive, and the details thereof will be described later. At this time, transfer transistor 3 (TRN-TR) is turned on in a linear state.

Figure 8D:
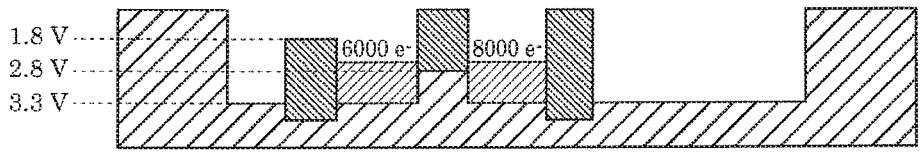
FIG. 8D is potential diagram 4 illustrating the pixel circuit according to the embodiment in the Geiger multiplication mode.

Turning-on of transfer transistor 3 (TRN-TR) redistributes the charges accumulated in the cathode of avalanche photodiode 1 to the cathode of avalanche photodiode 1 and to floating diffusion 2 (FD). The charge amounts to be redistributed are proportional to the capacity of the cathode of avalanche photodiode 1 and that of floating diffusion 2 (FD). Here, the capacity of the cathode of avalanche photodiode 1 is 1.5 fF and the capacity of floating diffusion 2 is 2.0 fF. For this reason, as illustrated in FIG. 8D, 8000 electrons are accumulated in floating diffusion 2 (FD) even after transfer transistor 3 (TRN-TR) is turned off in the subsequent step.

Figure 8E:
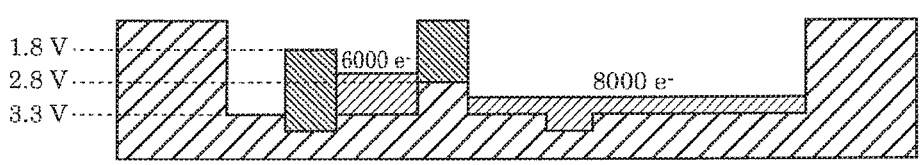
FIG. 8E is potential diagram 5 illustrating the pixel circuit according to the embodiment in the Geiger multiplication mode.
Figure 8F:
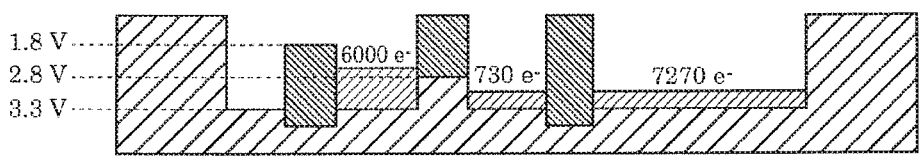
FIG. 8F is potential diagram 6 illustrating the pixel circuit according to the embodiment in the Geiger multiplication mode.

Leaked charges are readily generated in floating diffusion 2 (FD). Accordingly, as illustrated in FIG. 8E, count transistor 8 (MCT-TR) is immediately turned on to transfer the charges to memory 7. At this time, the charges accumulated in floating diffusion 2 (FD) are redistributed to floating diffusion 2 (FD) and memory 7. The charge amounts to be redistributed are proportional to the capacity of floating diffusion 2 (FD) and that of memory 7. The capacity of memory 7 is 20 fF. For this reason, as illustrated in FIG. 8F, 7270 electrons are accumulated in memory 7.

The series of operations illustrated in FIGS. 8A to 8F corresponds to one cycle of photocount operation.

Note that even in the case where two or more photons cause the photoelectric effect in the exposure time of 754 μsec, the photoelectric effect is also recognized as the photoelectric effect caused by one photon.

Figure 8G:
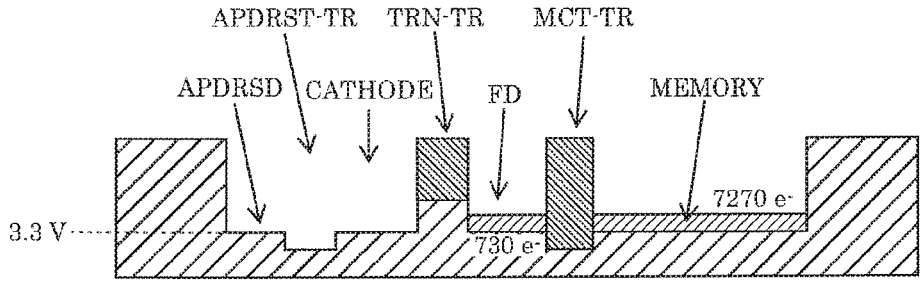
FIG. 8G is potential diagram 7 illustrating the pixel circuit according to the embodiment in the Geiger multiplication mode.
Figure 8H:
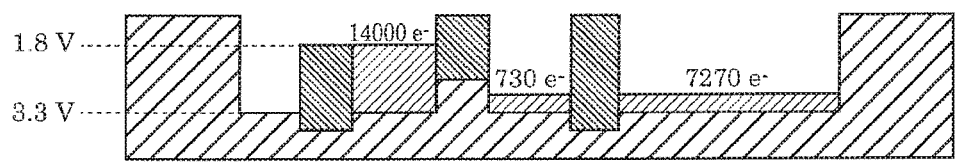
FIG. 8H is potential diagram 8 illustrating the pixel circuit according to the embodiment in the Geiger multiplication mode.
Figure 8I:
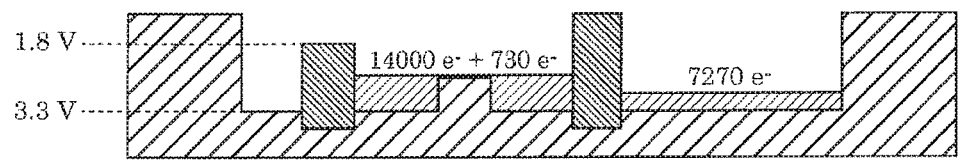
FIG. 8I is potential diagram 9 illustrating the pixel circuit according to the embodiment in the Geiger multiplication mode.
Figure 8J:
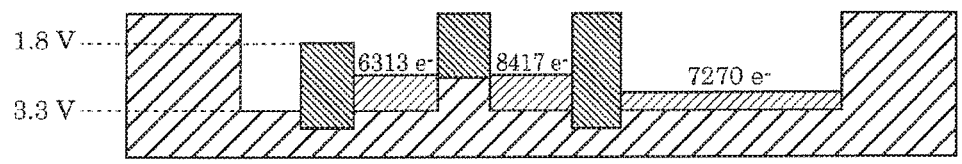
FIG. 8J is potential diagram 10 illustrating the pixel circuit according to the embodiment in the Geiger multiplication mode.
Figure 8K:
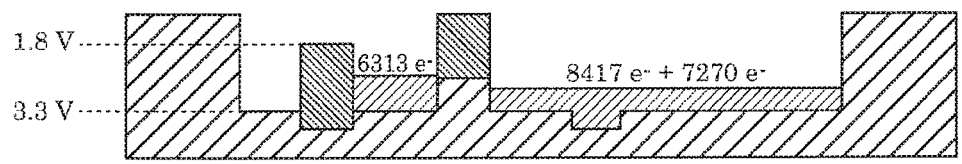
FIG. 8K is potential diagram 11 illustrating the pixel circuit according to the embodiment in the Geiger multiplication mode.
Figure 8L:
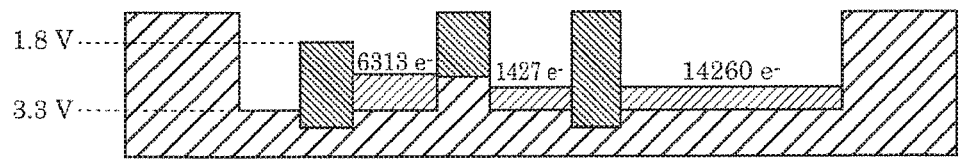
FIG. 8L is potential diagram 12 illustrating the pixel circuit according to the embodiment in the Geiger multiplication mode.

To detect the second photon, the cathode of avalanche photodiode 1 needs to be initialized once as illustrated in FIG. 8G. For this reason, first reset transistor 4 (APDRST-TR) is turned on. Whether floating diffusion 2 (FD) is initialized or not at this time depends on the ratio of the capacity of floating diffusion 2 (FD) and the capacity of memory 7. Floating diffusion 2 (FD) may be initialized in the case where the capacity of memory 7 is sufficiently larger than the capacity of floating diffusion 2 (FD). The initialization can reduce influences caused by leaked charges in floating diffusion 2 (FD). Here, floating diffusion 2 (FD) is not initialized because it cannot be said that the capacity of memory 7 is sufficiently larger than the capacity of floating diffusion 2 (FD). This is because the charges accumulated in memory 7 are reduced when the charges for one photon accumulated in memory 7 (7270 electrons as illustrated in FIG. 8G) are redistributed between memory 7 and the initialized floating diffusion 2 (FD). In particular, its influences are significant when one photon causes the photoelectric effect and any photon does not cause the photoelectric effect in the next cycle. There are no such influences when the first photon causes the photoelectric effect, and following the first photon, the second photon causes the photoelectric effect in the next cycle, because 14000 electrons are again accumulated in the cathode of avalanche photodiode 1.

The sequence illustrated in FIGS. 8H to 8L is a sequence similar to that illustrated in FIGS. 8B to 8F. By repeating the sequence similar to the above sequence 20 times, the charges generated as a result of the photoelectric effect caused by the photon at most 20 times can be integrated in memory 7.

The charges integrated in memory 7 according to the number of photons which cause the photoelectric effect are converted into a voltage in amplification transistor 6 (SF-TR) in the state where memory 7 is connected to floating diffusion 2 (FD) through count transistor 8 (MCT-TR), and the voltage is output. FIGS. 10A and 10B illustrate the output timing. FIG. 10A is a timing diagram in the case where conversion of the charge integrated in memory 7 into a voltage in amplification transistor 6 (SF-TR) and its output therefrom are followed by conversion of the initialized charge in floating diffusion 2 (FD) into a voltage in amplification transistor 6 (SF-TR) and its output therefrom. FIG. 10B is a timing diagram in the case where conversion of the initialized charge in floating diffusion 2 (FD) into a voltage in amplification transistor 6 (SF-TR) and its output therefrom are followed by conversion of the charge integrated in memory 7 into a voltage in amplification transistor 6 (SF-TR) and its output therefrom.

Figure 11C:
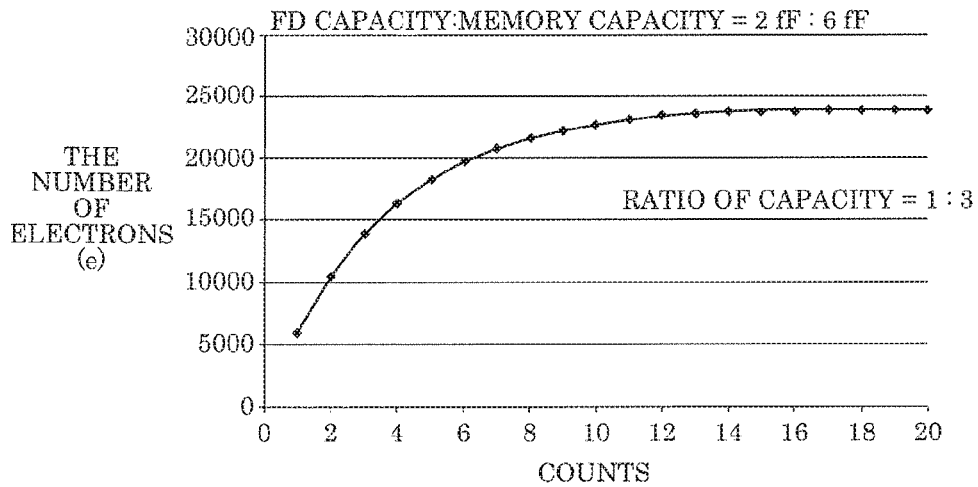
FIG. 11C is characteristic diagram 1 illustrating photocount characteristics according to Comparative Example in the Geiger multiplication mode.
Figure 11D:
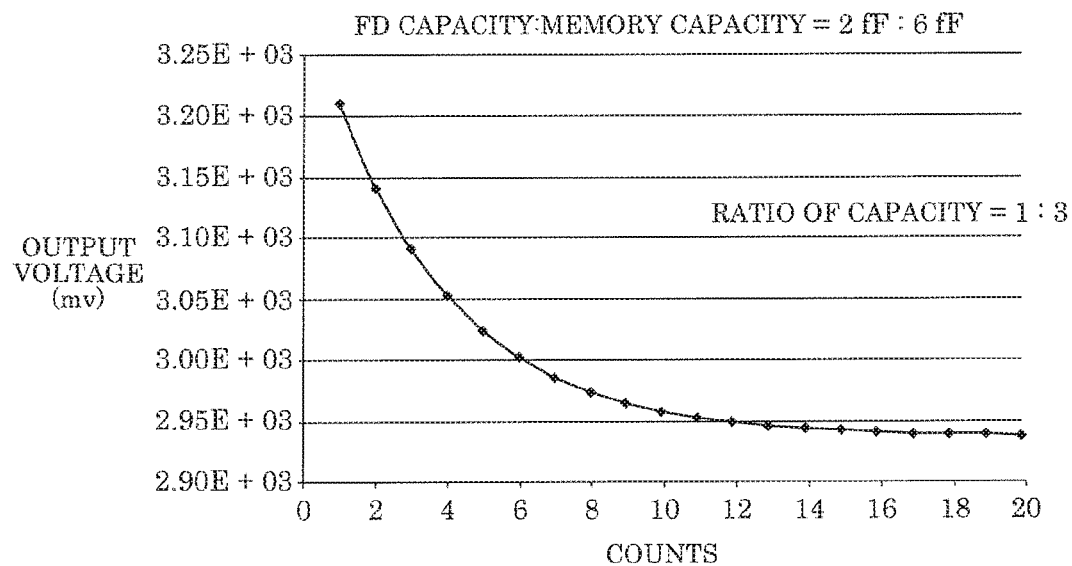
FIG. 11D is characteristic diagram 2 illustrating photocount characteristics according to Comparative Example in the Geiger multiplication mode.

In the case where the amount of charges integrated and accumulated in memory 7 is increased by the photoelectric effect continuously caused by photons, the amount of charges newly integrated in memory 7 is reduced (see FIG. 11A). For this reason, as illustrated in FIG. 11B, as the number of counts of photons increases, the slope of the output voltage tends to be smaller. A larger capacity of memory 7 can prevent this tendency more significantly. For comparison, characteristic diagrams are illustrated in FIGS. 11C and 11D, which illustrate photocount characteristics in the case where the capacity of memory 7 is 6 fF and the operational mode of avalanche photodiode 1 is the Geiger multiplication mode. As illustrated in FIG. 11D, in the case where the capacity of memory 7 is 6 fF, namely, the ratio of the capacity of floating diffusion 2 (FD) to the capacity of memory 7 is 1:3, the slope of the output voltage becomes small around the photocount of 10 or higher to an extent such that detection of the photocount is difficult. The present inventor, who has repeated tests and examinations, has found that the capacity of memory 7 is preferably at least 5 times the capacity of floating diffusion 2 (FD) to detect 20 photons in the photocount.

FIGS. 9H to 9L are potential diagrams of a photocount drive sequence represented with a potential when the first photon causes the photoelectric effect, and following the first photon, the second photon does not cause the photoelectric effect in the next cycle.

Figure 9H:
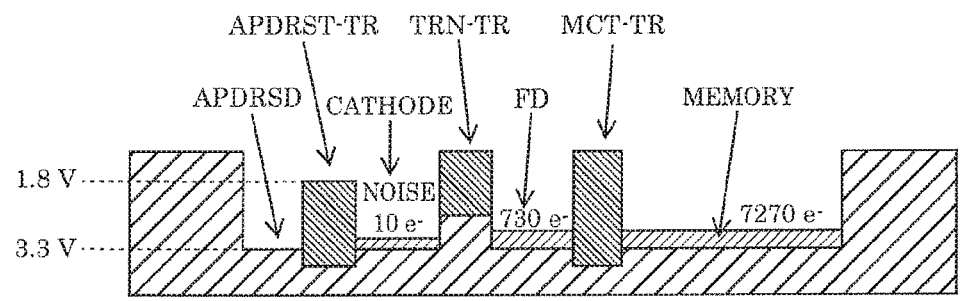
FIG. 9H is potential diagram 13 illustrating the pixel circuit according to the embodiment in the Geiger multiplication mode.
Figure 9I:
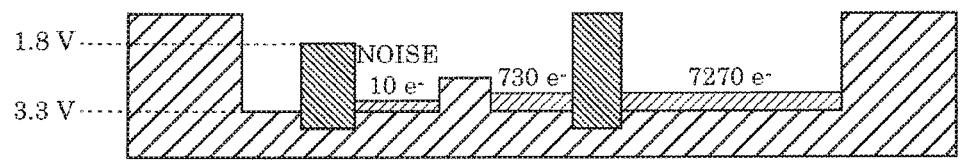
FIG. 9I is potential diagram 14 illustrating the pixel circuit according to the embodiment in the Geiger multiplication mode.
Figure 9J:
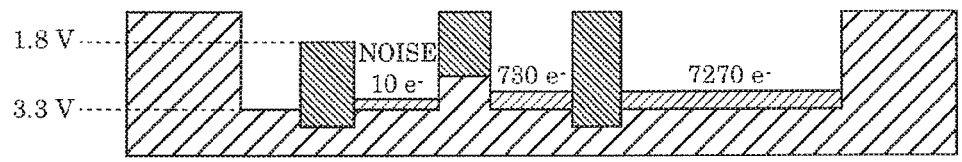
FIG. 9J is potential diagram 15 illustrating the pixel circuit according to the embodiment in the Geiger multiplication mode.

As illustrated in FIG. 9H, even after pixel cell 10 is exposed to light, the photon does not cause the photoelectric effect. For this reason, only 10 electrons due to noises are accumulated in the cathode of avalanche photodiode 1, for example. For this reason, as illustrated in FIG. 9I, even when transfer transistor 3 (TRN-TR) is turned on to incompletely connect the cathode of avalanche photodiode 1 and floating diffusion 2 (FD), the charges accumulated in the cathode of avalanche photodiode 1 and the charges accumulated in floating diffusion 2 (FD) are not redistributed.

The potential level when transfer transistor 3 (TRN-TR) is turned on is a level so as to provide a potential barrier of 2.8 V, rather than the level so as to completely connect the cathode of avalanche photodiode 1 and floating diffusion 2 (FD). This is for prevention of the redistribution of the charges accumulated in the cathode of avalanche photodiode 1 and the charges accumulated in floating diffusion 2 (FD) in the case where a photon does not cause the photoelectric effect. For this reason, as illustrated in FIG. 9I, the redistribution of charges through transfer transistor 3 (TRN-TR) is not performed, and floating diffusion 2 (FD) continuously holds the amount of charges accumulated (here, 730 electrons).

Figure 9K:
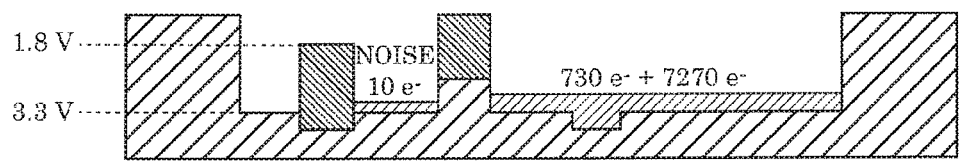
FIG. 9K is potential diagram 16 illustrating the pixel circuit according to the embodiment in the Geiger multiplication mode.
Figure 9L:
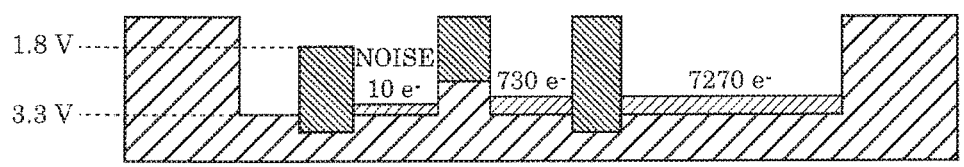
FIG. 9L is potential diagram 17 illustrating the pixel circuit according to the embodiment in the Geiger multiplication mode.

For this reason, as illustrated in FIG. 9K, the amount of charges accumulated in memory 7 is not varied by turning on count transistor 8 (MCT-TR).

FIGS. 12A to 12D are potential diagrams illustrating a drive sequence expressed with a potential when the operational mode of avalanche photodiode 1 is the linear multiplication mode. FIG. 13 is a timing diagram illustrating a drive sequence expressed with timing when the operational mode of avalanche photodiode 1 is the linear multiplication mode.

In the case where the operational mode of avalanche photodiode 1 is the linear multiplication mode, the solid-state image sensor according to the present embodiment including pixel cell 10 operates in a substantially similar manner to that of a standard image sensor.

When the drive sequence is started, initially, first reset transistor 4 (APDRST-TR), second reset transistor 5 (FDRST-TR), and count transistor 8 (MCT-TR) are turned on to initialize (reset) the cathode of avalanche photodiode 1, floating diffusion 2, and memory 7.

Figure 12A:
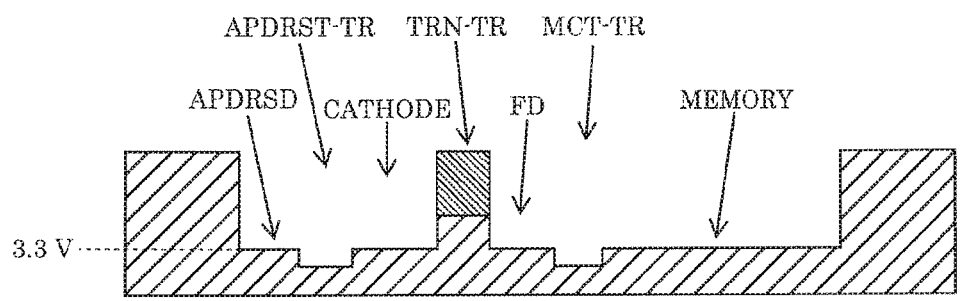
FIG. 12A is potential diagram 1 illustrating the pixel circuit according to the embodiment in a linear multiplication mode.
Figure 12B:
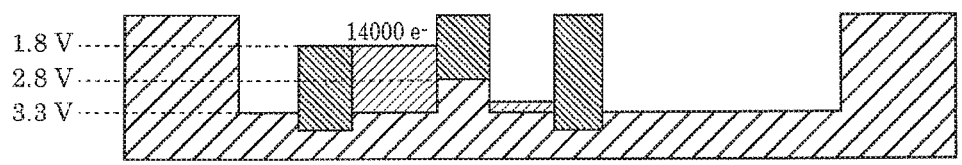
FIG. 12B is potential diagram 2 illustrating the pixel circuit according to the embodiment in the linear multiplication mode.
Figure 13:
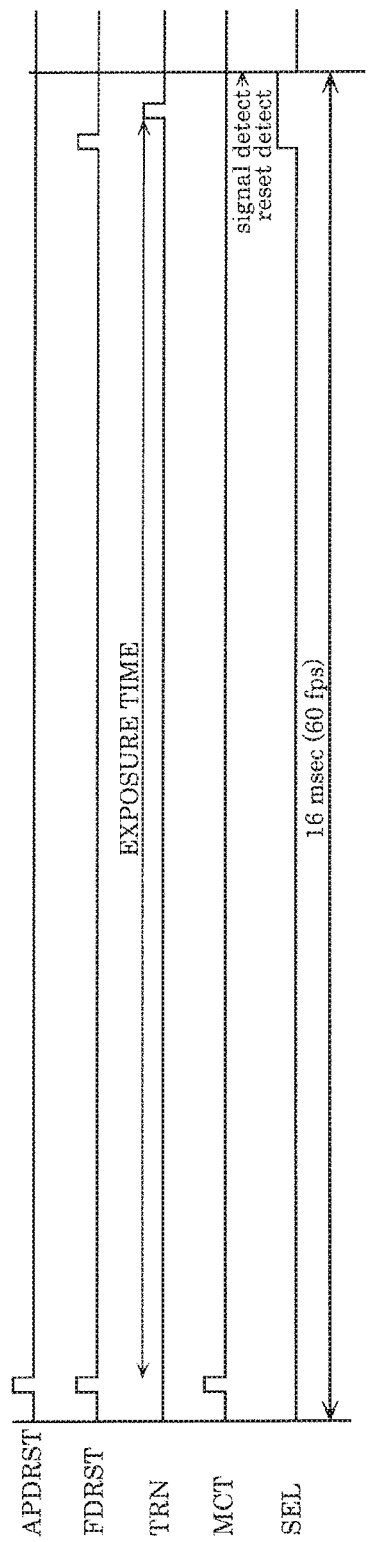
FIG. 13 is a timing diagram illustrating a drive sequence in the linear multiplication mode.

As illustrated in FIG. 12A, the cathode of avalanche photodiode 1, floating diffusion 2, and memory 7 are set at a potential of 3.3 V through the initialization.

In the next step, first reset transistor 4 (APDRST-TR), second reset transistor 5 (FDRST-TR), and count transistor 8 (MCT-TR) are turned off. At this time, the potential of the turn-off level of first reset transistor 4 (APDRST-TR) is kept lower (here, 1.8 V) than that of the turn-off level of transfer transistor 3 (TRN-TR). Thereby, the blooming prevention function described above works in the case where the amount of charges collected in the cathode of avalanche photodiode 1 reaches the saturated level, and the charges overflow to the APDRSD power supply through an off potential barrier of first reset transistor 4 (APDRST-TR).

In this state (the state where the potential level of first reset transistor 4 (APDRST-TR) is set at 1.8 V), pixel cell 10 is exposed to light. As illustrated in FIG. 13, the maximum exposure time is 16 msec at 60 fps.

The exposure time can be adjusted with an electronic shutter. The electronic shutter can be implemented by turning on first reset transistor 4 (APDRST-TR) and second reset transistor 5 (FDRST-TR) during the exposure.

Figure 12C:
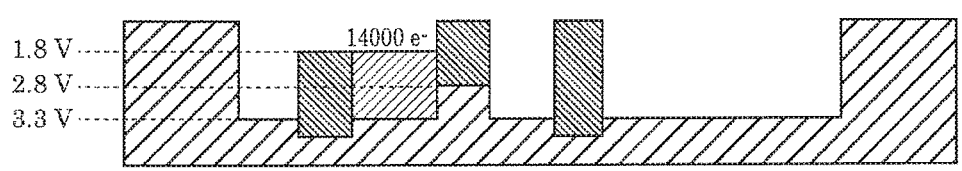
FIG. 12C is potential diagram 3 illustrating the pixel circuit according to the embodiment in the linear multiplication mode.
Figure 12D:
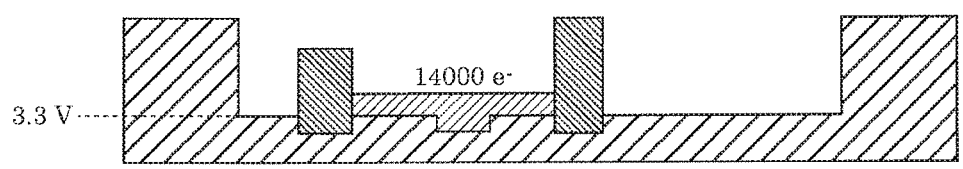
FIG. 12D is potential diagram 4 illustrating the pixel circuit according to the embodiment in the linear multiplication mode.

In the next step, second reset transistor 5 (FDRST-TR) is turned on to initialize floating diffusion 2 (FD) as illustrated in FIG. 12C. After the initialization, as illustrated in FIG. 12D, the potential level of transfer transistor 3 (TRN-TR) is controlled to 3.3 V to completely connect the cathode of avalanche photodiode 1 and floating diffusion 2 (FD). At this time, in the state where a fourth voltage (voltage for turning on transfer transistor 3 (TRN-TR)) is applied to the gate of transfer transistor 3 (TRN-TR), the potential barrier between the source and the drain is equal to or less than the potential of floating diffusion 2 initialized by second reset transistor 5 (FDRST-TR). The charges accumulated in floating diffusion 2 (FD) are converted into a voltage in amplification transistor 6 (SF-TR), and the voltage is output. FIG. 13 is a timing diagram illustrating the case where conversion of the initialized charges of floating diffusion 2 (FD) into a voltage in amplification transistor 6 (SF-TR) and its output therefrom are followed by conversion of the charges accumulated in floating diffusion 2 (FD) into a voltage in amplification transistor 6 (SF-TR) and its output therefrom.

[3. Application Example]

Imaging device 200 including a solid-state image sensor having the configuration above will now be described.

Figure 14:
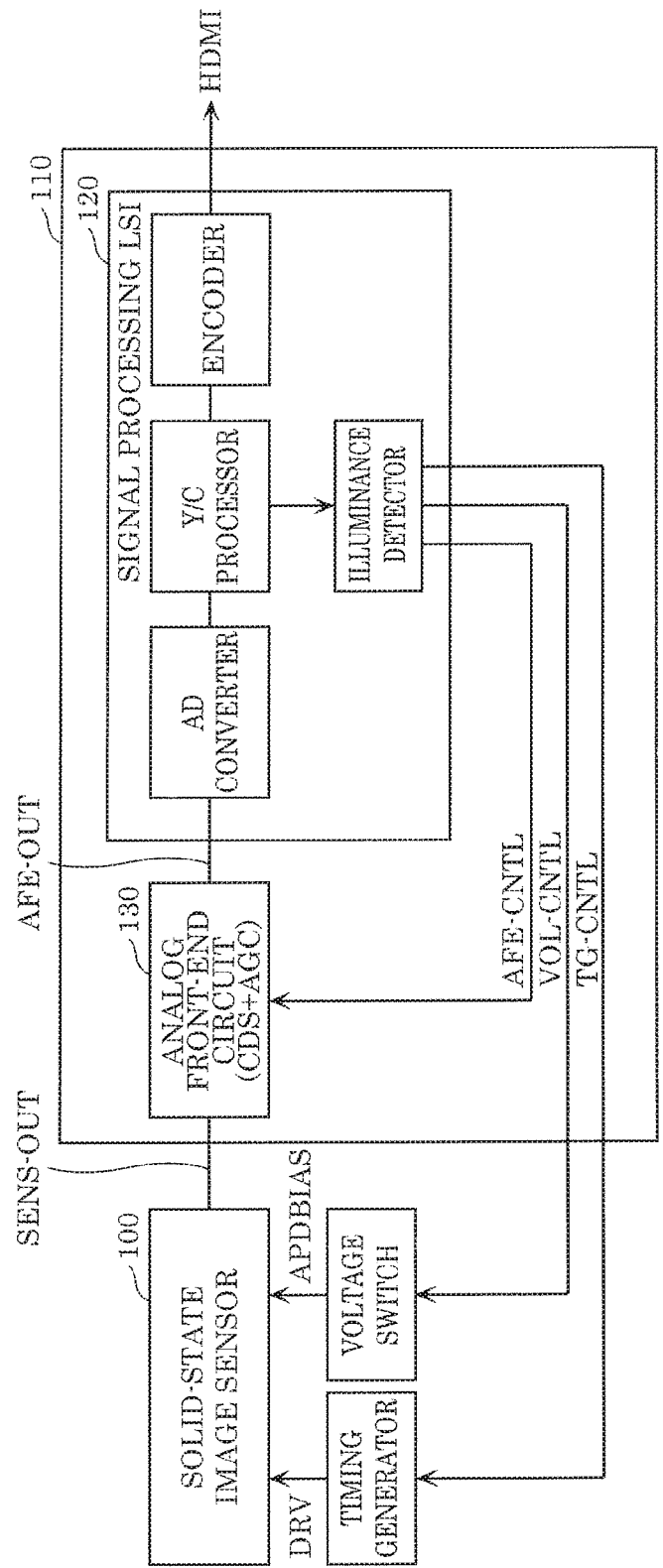
FIG. 14 is a block diagram illustrating a configuration of an imaging device according to the embodiment.

FIG. 14 is a block diagram illustrating a configuration of imaging device 200.

As illustrated in the drawing, imaging device 200 includes solid-state image sensor 100 according to the present embodiment having the configuration above, and signal processing circuit 110 which sets a bias to be applied to avalanche photodiode 1 at one of a first bias (for example, −25 V) and a second bias (for example, −27 V) based on a signal output from solid-state image sensor 100.

Signal processing circuit 110 includes signal processing LSI 120 and analog front-end circuit 130.

Solid-state image sensor 100 outputs pixel signal SENS-OUT to analog front-end circuit 130. Analog front-end circuit 130 then detects a signal component from SENS-OUT, applies a gain, and outputs an AFE-OUT signal. Signal processing LSI 120 then compares the AFE-OUT signal to a preset threshold level to determine whether the target object has low illuminance or not. When signal processing LSI 120 determines that the target object has low illuminance, signal processing LSI 120 controls voltage switch 140 using a control signal VOL-CNTL to set a bias to be applied to avalanche photodiode 1 to a second bias (for example, −27 V). This switches avalanche photodiode 1 to the Geiger multiplication mode. In contrast, when signal processing LSI 120 determines that the target object does not have low illuminance, signal processing LSI 120 controls voltage switch 140 using the control signal VOL-CNTL to set the bias to be applied to avalanche photodiode 1 at a first bias (for example, −25 V). This switches avalanche photodiode 1 to the linear multiplication mode.

As described above, imaging device 200 can photograph images by switching the operational mode of avalanche photodiode 1 between the Geiger multiplication mode and the linear multiplication mode according to the illuminance of the target object.

(Additional Remarks)

The embodiment has been described as above by way of an example of techniques disclosed in the present application. However, the techniques according to this disclosure will not be limited to these, and are also applicable to embodiments appropriately modified, replaced, added, or omitted without departing the gist of this disclosure.

INDUSTRIAL APPLICABILITY

The solid-state image sensor and the imaging device according to this disclosure can be widely used in apparatuses/devices which photograph images.

What is claimed is:

1. A solid-state image sensor, comprising:
a pixel array including pixel cells arranged in a matrix, wherein each of the pixel cells includes:
an avalanche photodiode having a first mode in which a charge amount of charges approximately proportional to the number of photons which cause photoelectric conversion is collected in a cathode of the avalanche photodiode when photons enter the avalanche photodiode under application of a first bias, and a second mode in which a saturated amount of charges is collected in the cathode when photons enter the avalanche photodiode under application of a second bias having a larger potential difference from a potential difference of the first bias and one photon causes photoelectric conversion;
a floating diffusion which accumulates charges;
a transfer transistor which connects the cathode of the avalanche photodiode and the floating diffusion;
a first reset transistor for resetting charges collected in the cathode of the avalanche photodiode;
a second reset transistor for resetting charges accumulated in the floating diffusion;
an amplification transistor for converting a charge amount of the charges accumulated in the floating diffusion into a voltage;
a memory which accumulates charges; and
a count transistor which connects the floating diffusion and the memory,
wherein, in a case where the avalanche photodiode is in the second mode, a potential barrier between a source and a drain of the transfer transistor when the transfer transistor is turned on is higher than a potential level of the cathode of the avalanche photodiode, the transfer transistor being turned on for redistributing the charges accumulated in the cathode to the cathode and to the floating diffusion.

2. The solid-state image sensor according to claim 1, wherein the memory has a capacity that is at least five times a capacity of the floating diffusion.

3. The solid-state image sensor according to claim 1, wherein the memory is a capacitor having a laminate structure.

4. The solid-state image sensor according to claim 1, wherein the memory is a capacitor including an electrode, a semiconductor layer, and an insulating layer disposed between the electrode and the semiconductor layer.

5. The solid-state image sensor according to claim 1, wherein the memory is a capacitor including a first electrode, a second electrode, and an insulating layer disposed between the first electrode and the second electrode.

6. The solid-state image sensor according to claim 5, wherein the avalanche photodiode, the floating diffusion, the transfer transistor, the first reset transistor, the second reset transistor, and the amplification transistor are disposed in a semiconductor substrate,
the capacitor includes the first electrode and the second electrode facing each other, and the insulating layer interposed between the first electrode and the second electrode,
the first electrode and the second electrode are disposed in a wiring layer region located vertically above a main flat surface of the semiconductor substrate, and
first electrodes in the pixel cells are connected to each other without a via.

7. The solid-state image sensor according to claim 6, wherein the first electrode is grounded at a predetermined potential through a via outside the pixel array.

8. The solid-state image sensor according to claim 1, wherein the first reset transistor has a threshold voltage equal to or lower than a threshold voltage of the transfer transistor.

9. The solid-state image sensor according to claim 1, wherein a potential barrier between a source and a drain of the first reset transistor under application of a first voltage to a gate of the first reset transistor is lower than a potential barrier between a source and a drain of the transfer transistor under application of a second voltage to a gate of the transfer transistor.

10. The solid-state image sensor according to claim 8, wherein among the charges collected in the cathode of the avalanche photodiode, at least part of charges having a potential higher than the potential barrier between the source and the drain of the first reset transistor is transferred to the drain of the first reset transistor.

11. The solid-state image sensor according to claim 1, wherein in an operation in the second mode, the potential barrier between the source and the drain under application of a voltage to the gate of the transfer transistor is higher than a potential of the floating diffusion initialized by the second reset transistor.

12. The solid-state image sensor according to claim 1, wherein in an operation in the first mode, the potential barrier between the source and the drain under application of a voltage to the gate of the transfer transistor is equal to or lower than the potential of the floating diffusion initialized by the second reset transistor.

13. An imaging device, comprising:
the solid-state image sensor according to claim 1; and
a signal processing circuit which sets a bias to be applied to the avalanche photodiode at one of the first bias and the second bias based on a signal output from the solid-state image sensor.

* * * * *